United States Patent [19]

Souder, Jr. et al.

[11] 4,110,587
[45] Aug. 29, 1978

[54] METHOD AND APPARATUS FOR HEATING FOOD

[75] Inventors: James J. Souder, Jr.; Lindsey E. Waldorf, both of Ann Arbor, Mich.

[73] Assignee: Patents Licensing International, Ltd., Southfield, Mich.

[21] Appl. No.: 758,083

[22] Filed: Jan. 10, 1977

Related U.S. Application Data

[62] Division of Ser. No. 560,396, Mar. 20, 1975, Pat. No. 4,020,310.

[51] Int. Cl.² ............................................. H05B 5/08
[52] U.S. Cl. ............................... 219/10.49 R; 99/416; 219/10.71; 219/10.75; 219/386; 312/236; 426/243
[58] Field of Search ............... 219/10.49, 10.67, 10.71, 219/10.73, 10.75, 10.79, 218, 385, 386, 387, 402, 407, 468, 520, 521, 525; 99/416; 443 R; 312/236; 426/243

[56] References Cited

U.S. PATENT DOCUMENTS

| | | | |
|---|---|---|---|
| 2,625,242 | 1/1953 | Reed | 219/10.49 |
| 3,079,913 | 3/1963 | Nelson | 219/10.55 E |
| 3,294,946 | 12/1966 | Baermann | 219/10.49 |
| 3,608,627 | 9/1971 | Sherlin | 219/387 |
| 3,745,290 | 7/1973 | Harnden | 219/10.49 |
| 3,777,094 | 12/1973 | Peters | 219/10.49 |
| 3,781,503 | 12/1973 | Harnden et al. | 219/10.49 |
| 3,786,222 | 1/1974 | Harnden et al. | 219/10.49 |
| 3,790,735 | 2/1974 | Peters | 219/10.49 |
| 3,843,857 | 10/1974 | Cunningham | 219/10.49 |
| 3,887,253 | 6/1975 | Bridges et al. | 312/236 |
| 3,908,749 | 9/1975 | Williams | 312/236 |
| 3,924,100 | 12/1975 | Mack et al. | 219/386 |

Primary Examiner—Bruce A. Reynolds
Attorney, Agent, or Firm—Krass & Young

[57] ABSTRACT

Meals for institutional feeding are arranged on trays in a central commissary with hot and cold food portions in separate containers. The containers for the hot items have bases formed with metallic plates and thermally insulated covers with internal metallic heat radiators. The trays are arranged in stacks in a refrigerated transport cart having spaced shelves which extend between the trays and include induction heating coils which produce heat generating currents in the metallic elements of the bases and covers of the hot food containers, heating these food portions while the other items are refrigerated. The hot food containers are provided in a variety of configurations each of which is heated at a different rate by the coils so the serving temperature of the food is determined by the type of its container.

5 Claims, 11 Drawing Figures

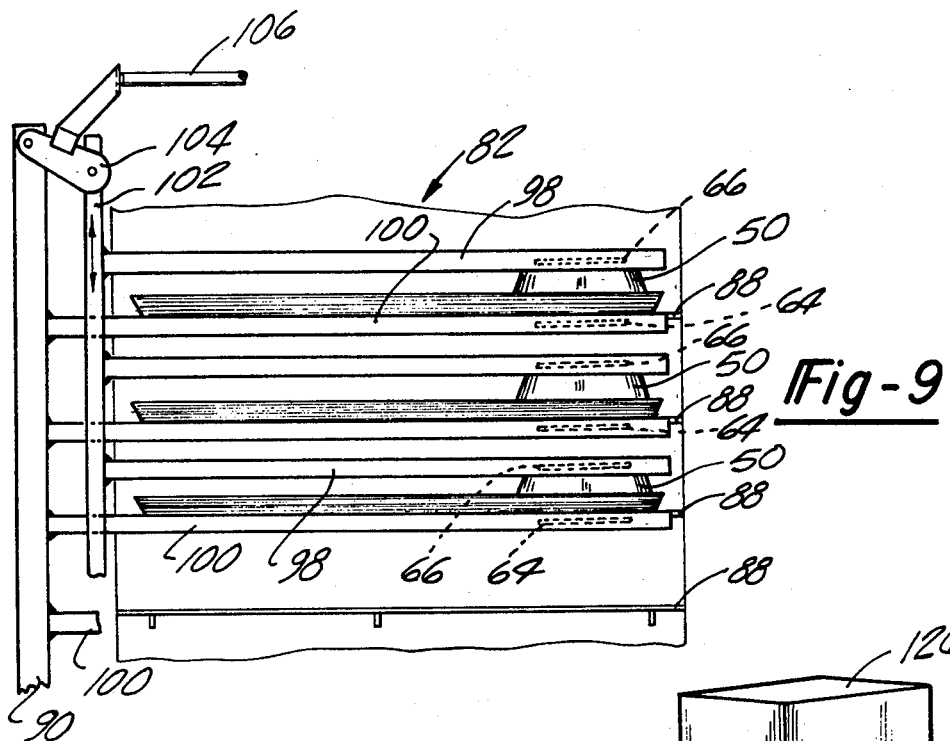
Fig-9
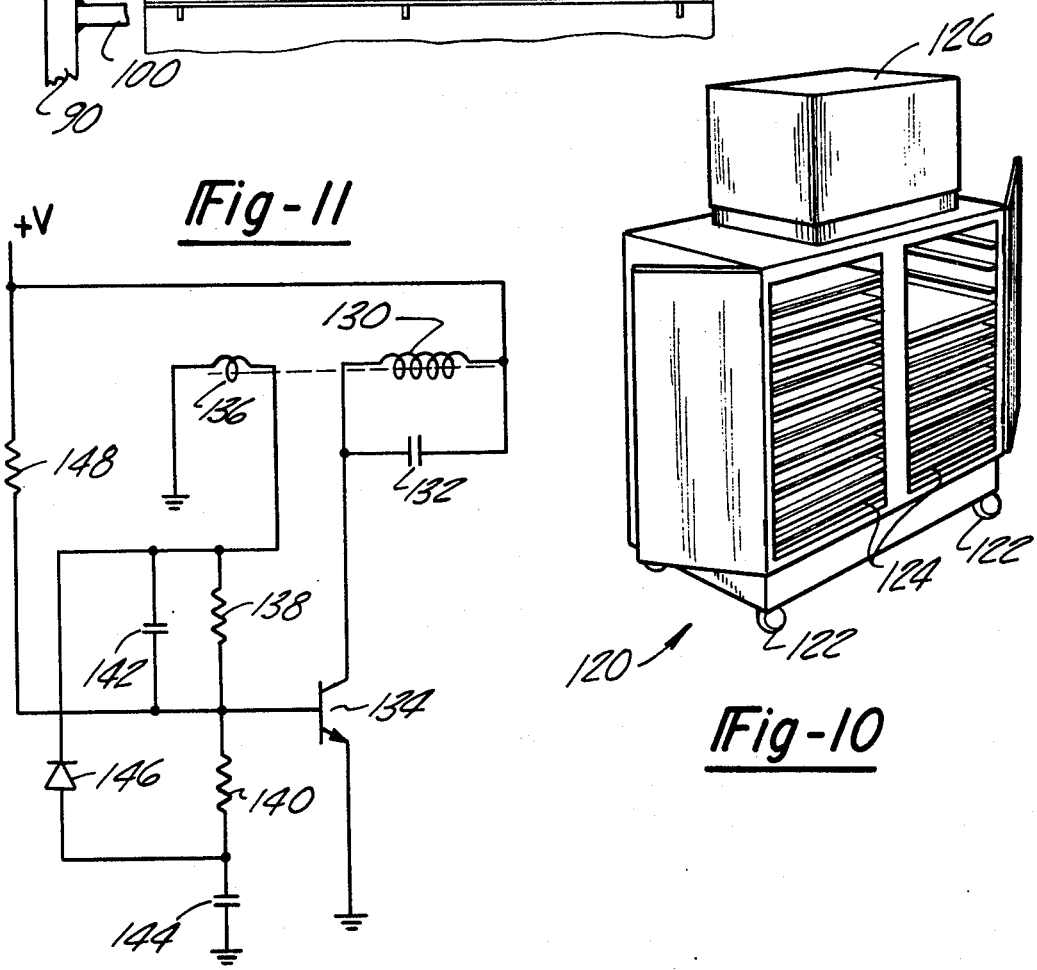
Fig-11
Fig-10

METHOD AND APPARATUS FOR HEATING FOOD

This is a division, of application Serial No. 560,396, filed Mar. 20, 1975, now U.S. Pat. No. 4,020,310.

BACKGROUND OF THE INVENTION

1. Field of the Invention

This invention relates to methods and apparatus for heating food supported in closed containers by induction heating of conductive elements in the containers, and more particularly to apparatus for transporting and thermally conditioning a plurality of hot and cold food items for use in hospitals or the like.

2. Prior Art

A variety of thermally controlled transport systems are in use and have been proposed for moving individual food portions, packaged in containers from which they are to ultimately be consumed, and arranged with different similarly packaged foods on a tray to form an entire meal, from a central commissary in which the food is prepared to the ultimate consumers. These systems have reached their highest form of development in hospitals where patients must be served meals which vary on an individual basis. These transport systems have the objective of giving the central commissary a maximum degree of control over the composition of a meal and its thermal status to minimize the necessity for the use of highly skilled labor in the delivery of the meals to the patients. Since the patients may receive the meals a substantial time after they leave the kitchen or commissary it has been necessary to provide transport systems capable of refrigerating and heating the food during transport. Usually the food has previously been cooked and the heating is performed to thaw frozen portions or bring the food to a palatable serving temperature.

Historically, use of simple banquet covers over the food plates represented the first effort to maintain foods at proper temperatures during transport. To overcome the heat loss that inevitably resulted pellets of high thermal inertia were next proposed for incorporation into food containers and a pellet heating oven was established at the kitchen or central food assembly point. Pellet systems were superseded by transport carts having separate refrigerated and heated compartments but these carts required the assembly of the individual food containers into a complete meal when the cart reached the patient. The shortcomings of these systems, including the requirement for the exercise of skill in the final assembly of a meal for the patient and the time required for the assembly operation, led to the development of systems wherein the meal is fully assembled at a central point and individual resistance heaters, disposed in either the food containers or the transport trays are used to maintain food temperature during transport. These systems are expensive and their exposed parts create a danger of burning the handlers.

The present invention is directed toward a method and apparatus for heating food and a system for transporting food from a central location to the individual consumers which vests complete control over the organization of a meal and the serving temperature of the individual components of the meal in the central location, requiring only unskilled labor to deliver trays containing the prepared meals to the patients.

SUMMARY OF THE INVENTION

The present invention broadly contemplates the provision of closed containers for food, and more particularly for single portions of food, which allow the food to be warmed within the containers without heating the exteriors of the containers. As embodied in a preferred form of the invention food containers are formed of a pair of separable sections. The lower sections are formed as dishes of thin sheet metal. They may be surrounded by an electrically non-conductive thermally insulating shelf or alternatively may be supported in a complementary depression formed in a tray of electrically non-conductive thermally insulating material. Their edges mate with the edges of cover sections formed of thermally insulated material and having thin sheet metal liners fixed to their undersides to enclose a food containing volume.

These containers are adapted to be used with induction heating apparatus including coils supported both above and below the containers to induce separate fields in the lower metal dish and in the metal section of the cover. The resultant heating of the dish warms the food by conduction and convection and the top plate, heated to a different temperature, warms the food by radiation. In this arrangement the food can be warmed rapidly and uniformly without any necessary stirring or movement of the food and without the danger of scorching. This method may be used to cook food, to warm previously cooked food, or to thaw frozen foods. The rapid thaw minimizes loss of nutritional value and damage to the cosmetic qualities of the food.

In alternative embodiments of the invention this simultaneous heating of the food in a closed container, by the bottom through conduction and by the top through radiation, using separate heating sources to control the temperatures optimally and separately, may utilize various other forms of heaters such as electric resistance or piezo-electric heaters.

A food portion to be heated is inserted in a container formed in accordance with the present invention at a central kitchen or commissary or the like and the container is closed and assembled with other containers of various other food portions on a tray. The amount of heat induced into a particular food portion may be controlled at the food assembly point by placing it in a container having a particular configuration. The containers may vary from one another in the configuration of the metal material which forms the induction heating elements or in the positions of those elements relative to the base of the container, which controls the distances of the metal elements from the induction heating coils and accordingly the magnitude of eddy currents induced in the elements. The elements may also be shaped so as to localize the heating effect in certain parts of the container. By proper selection of the containers for food at the food assembly point, a skilled operator may thus control the temperature of each food item at the time of serving.

A plurality of the trays are then arranged on a cart which is preferably refrigerated to maintain those food portions not disposed in insulated containers at a proper temperature. The food cart includes spaced shelves with induction heating coils built into the shelves. The induction heating coils are located in the shelves so as to generate electromagnetic fields which induce eddy currents into the containers to be heated. The power supply for the induction heating coils may either be supported on the cart, and battery powered, so as to heat the foods in transit or it may form part of a stationary unit which plugs into the cart. Alternatively, the induction heating coils may form part of a stationary refrigerated unit containing parallel spaced shelves that accept a plurality of trays stacked on a cart and bring the food portions to their individual serving temperatures.

The shelves may be formed of split sections, one of which is adapted to move normally to bring the enclosed induction heating coils into proximity to the containers to be heated. The motion may be triggered by movement of the tray stack into the stationary unit or by the closure of the unit door after the tray cart has been moved into place.

The method and apparatus of the present invention thus forms a system allowing the preparation of meals at a central point and the quick distribution of those meals to a variety of consumers by unskilled personnel with assurance that the food will arrive at a serving temperature specified at the central location.

Other objectives, advantages and applications of the present invention will be made apparent by the following detailed description of several embodiments of the invention. The description makes reference to the accompanying drawings in which:

FIG. 9 is a sectional view through a portion of the heating and cooling chamber of FIG. 7, with trays supported on the cart inserted therein;

FIG. 10 is a perspective view of a mobile heating and refrigerating food cart associated with stationary refrigeration apparatus; and FIG. 11 is an electrical schematic diagram of an oscillator for powering the induction heating coils.

Figure 1:
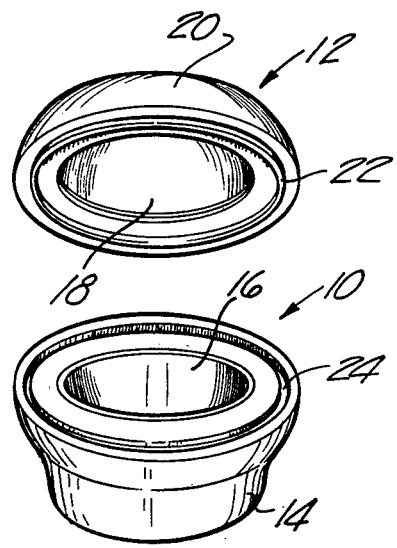
FIG. 1 is a perspective view of a two-part food portion container, formed in accordance with the present invention.
Figure 2:
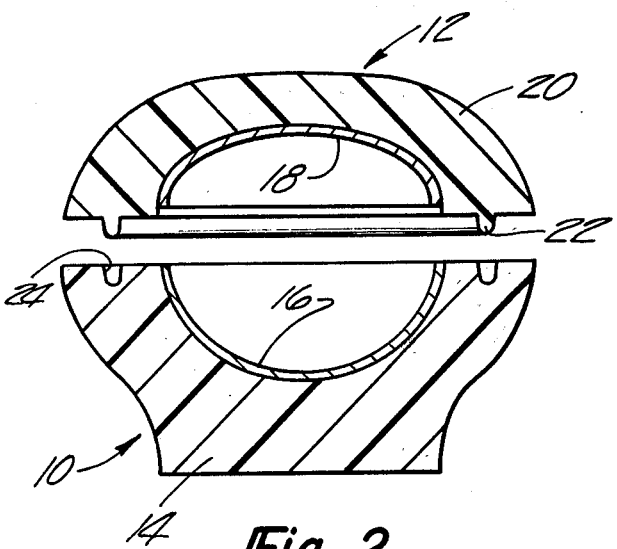
FIG. 2 is a sectional view through the two halves of the food container of FIG. 1.

Referring to FIGS. 1 and 2, a food container formed in accordance with the present invention consists of a bottom or dish section, generally indicated at 10, and a separable top cover portion, generally indicated at 12. The container is intended to support a food portion which will later be consumed directly on the dish section 10 after the cover 12 is removed. The food portion is heated while supported in the container. This heating may be for the purpose of thawing, reheating or cooking the food portion, or simply to maintain an already hot food portion at a controlled temperature during transit.

The bottom section 10 consists of a dish-shaped member 14 formed of plastic having low thermal conductivity. Preferably a foamed plastic such as foamed polyurethane or polystyrene is employed to form section 14. The interior of the plastic section 14 is lined with a sheet metal dish 16. The dish is preferably formed of aluminum because of its light weight, low cost, and resistance to corrosion. It is preferably relatively thin so that eddy currents induced in it by induction heating coils which will be subsequently described, quickly heat it to operating temperature and when removed from the heating coils the dish quickly cools to prevent consumer burns. For example, it may be formed of 0.010 inch thick aluminum. The cost of the section 16 is sufficiently low that it may be described after use, eliminating the necessity for washing. It may be formed integrally with the insulated base portion 14 but is preferably separable therefrom so the base may be reused.

The top section 12 consists of a complementary sheet metal liner 18 shaped to cooperate with the section 16 to form a closed cavity and a surrounding insulated cover 20, preferably formed of the same foam plastic as the base 14. The sheet metal liner is preferably produced by stamping but could alternatively be vapor deposited, plated, or otherwise coated on the plastic. The term "metal sheet" as used hereinafter is intended to encompass all of these alternatives. The insulated cover 20 has a ridge 22 extending around its bottom edge which mates with a complementary groove 24 formed in the insulated portion 14 of the base to close the container.

When a food portion is supported within the closed container and the container is placed between a pair of induction heating coils of a type which will subsequently be described, so that the lower coil induces eddy currents in the plate section 16, and causes heating of the plate and the top coil similarly heats the plate 18, thermal energy is transferred to the food portion. The food portion is heated by conduction through its contact with the lower plate section 16 and the cover section 18 heats the food by radiation. The temperature of the two metallic sections may be independently controlled, either by their configurations or the configurations of their supporting plastic sections, or the timing and magnitude of the currents passed through the induction coils, to optimize the heating of the food. This arrangement allows food to be heated more quickly than it could be in a conventional container wherein only the bottom portion is warmed. Rapid heating minimizes the deterioration of food which reduces nutritional content and deleteriously effects its appearance. In contrast to the prior art, the rapid heating can be achieved without the need for heating the base section 16 to a temperature which might scorch the food.

Insulated sections 14 and 20 maintain the heat within the interior of the container so that there is little heat loss to the atmosphere and the heating can be achieved in a refrigerated environment.

In other embodiments of the invention the metallic elements 16 and 18 could be heated by some means other than induction heating. For example, resistance heating elements might be built into the containers to heat the top and bottom to separate temperatures which optimize the thermal transfer to the food.

Figure 3:
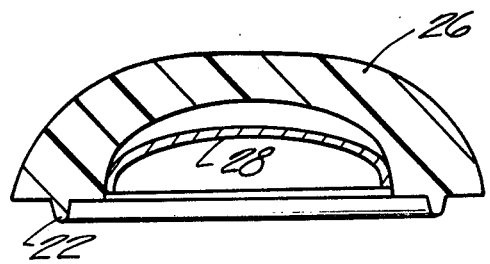
FIG. 3 is a sectional view through an alternative form of cover for the food container.

In the alternative embodiment of the cover section illustrated in FIG. 3 an insualted top section 26 has a metallic top radiating element 28 connected to it at their common perimeter. The main section of the top metallic element 28 is spaced beneath the insulated section 26 to form a dead air space between the two, increasing the insulation factor of the unit. A similar arrangement could be employed with respect to the bottom section.

While the metal heating elements of these embodiments allow for circularly symmetrical current flow, in alternative embodiments the elements may be formed with geometrics which a nonsymmetrical eddy current flow. This may take the form of voids or of thickened sections on the plate.

Figure 4:
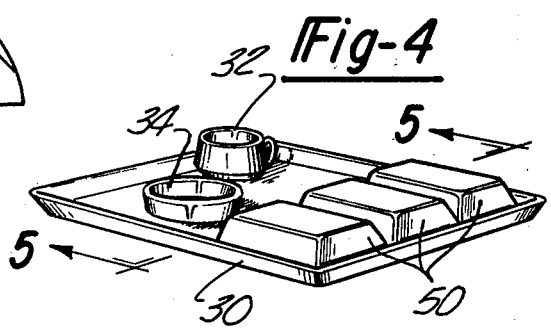
FIG. 4 is a perspective view of a tray containing food portions forming a complete meal, including three food containers formed in accordance with an alternative embodiment of the invention.
Figure 5:
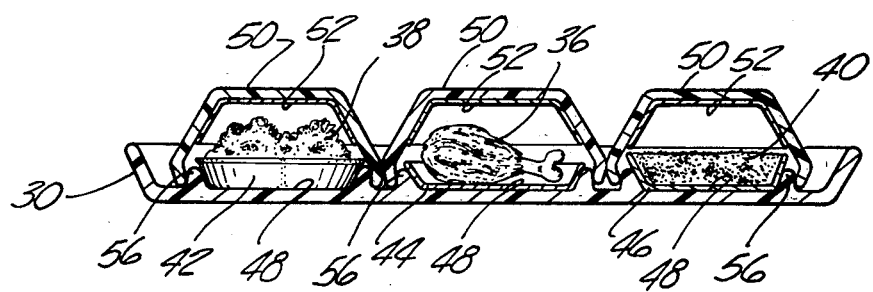
FIG. 5 is a sectional view through the tray of FIG. 4 illustrating another form of food container.

FIGS. 4 and 5 illustrate an alternative form of food container wherein the lower insulated sections are formed by cavities in a tray 30 constructed of an electrically and thermally insulating material. The tray is adapted to contain a complete meal which may typically include an entree 36, a vegetable 38 and soup 40, all of which are to be served heated, and a beverage 32 and cold dessert 34. The foods to be heated are supported in thin aluminum dishes 42, 44 and 46. The dishes are set within cavities 48 formed in the top surface of the tray 30.

Casserole covers 50 having sheet metallic inserts 52 formed on their interior surfaces are adapted to engage lips 56 surrounding the cavities in the tray to cover the food portions contained in the cavities. The covers may have vent holes to control the flow of convection currents within the closed containers. The dishes 42, 44 and 46 may each be somewhat different in configuration so that a different amount of heat is induced in each dish when the three are placed over the same form of induction heating coil. For example, the dishes may each have a different resistance resulting from a different thickness or alloy, or they may be shaped so that their edges are supported on the lips 56 surrounding the cavities and their bottoms are spaced from the bottom walls of the cavity by differing distances. Alternatively, the dishes may all have similar configurations and the rate of heat input may be controlled by spacing inserts placed between the dish and the coil. Since the amount of energy induced in the dish is an inverse exponential function of the separation of the dish from the coil the spacing of the two affects the heating of the dish. By placing the food portion in a particular form of container the serving temperature of the food portion may thus be controlled.

Figure 6:
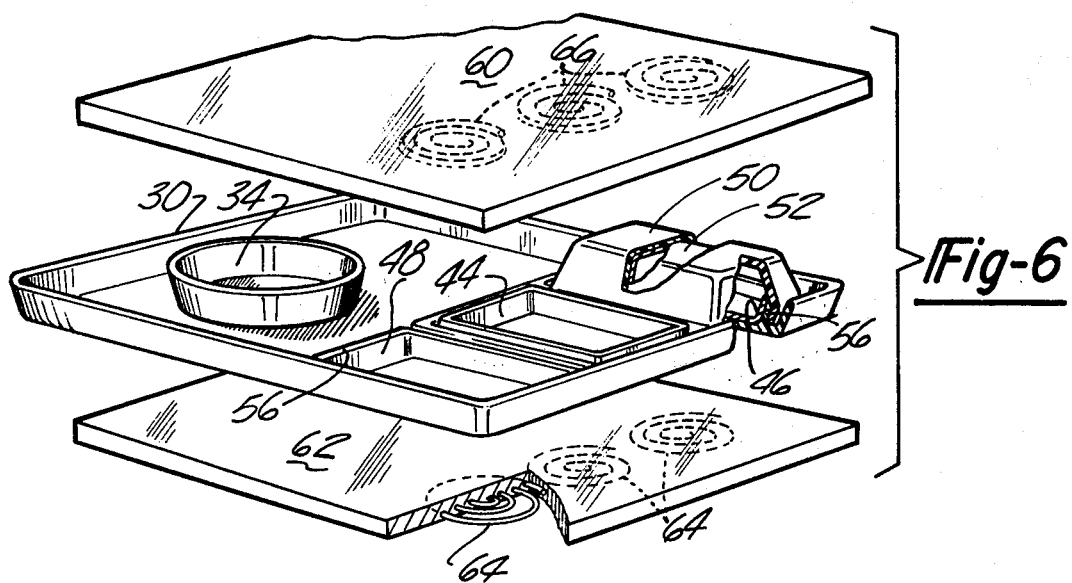
FIG. 6 is a detail perspective view of the tray of FIGS. 4 and 5 in spaced relationship between a pair of shelves containing induction heating coils.

FIG. 6 illustrates, in exploded, perspective form, a tray 30 supported for heating between a pair of shelves 60 and 62. The bottom shelf 60 has three flat, spirally wound, induction heating coils 64 built into it. The three coils 64 formed in the lower shelf are spaced relative to one another as are the cavities and are adapted to generate electric magnetic fields which induce eddy currents in the metallic dishes, 42, 44 and 46. In FIG. 6, for purposes of illustration, one of the cavities is shown empty, one of the cavities is shown containing the metallic dish 44, and the third cavity is shown fitted with a cover 50. Similarly, the three induction heating coils 66 disposed internally on the upper shelf, with their axes parallel to its surface, are adapted to generate fields which induce currents in the metallic inserts 52 of the three cover sections. In this manner the temperatures of the metal dishes and the top cover inserts may be separately controlled to coordinate their heating of the food.

Foods disposed within containers to be heated are thus warmed by conduction from their supporting dishes and by radiation from the metallic elements of the covers, and by convection currents generated within the closed container. The heat is retained within the containers by the insulated elements of the cover and the insulating properties of the tray 30. The other food items supported on the tray are not subjected to heat and if the shelves 60 and 62 are supported in a refrigerated area the cold items may be maintained in a refrigerated condition while the food portions in the containers are being heated.

Since heating only occurs when the metallic portion of a food container is placed in proximity to one of the induction heating coils, containers for food to be refrigerated, which do not include any metallic elements, may be supported in the tray cavities above the induction heating coils without imparting any heat to these containers. If a tray supporting containers with metallic inserts is inserted between the heating coils in a reversed position, so that the metallic inserts are not in proximity to the coils, no heating will result. Also, if a heater is used with only bottom or top induction heating coils, but not both, a container with a single metallic insert can be inverted to avoid heating of the contents.

Figure 7:
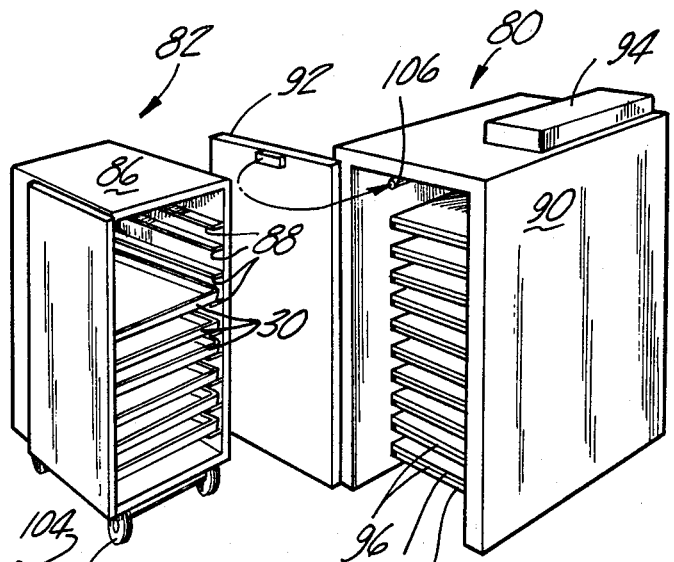
FIG. 7 is a perspective view of a cart supporting a plurality of trays of the type illustrated in FIG. 5 positioned to be inserted into a stationary refrigerating and heating cabinet.

FIG. 7 illustrates a heating and refrigerating station, generally indicated at 80, which cooperates with a mobile cart, generally indicated at 82, to thermally condition food on a plurality of trays 30, supported on the cart 82, and containing complete meals. The food portions to be heated are supported within food containers formed in accordance with the present invention, having radiating metal sheets in their covers and metallic inserts in the lower dish sections.

The cart 82 is supported on wheels 84 affixed to a rectangular structure 86. Horizontal guide rails 88 are affixed at spaced intervals on the opposed sides of the interior walls of the structure so that a plurality of trays may be supported within the cart with their opposed elongated side edges resting on the guides 88. The guides are spaced from one another vertically so that appreciable space separates the top of the food item supported on one tray from the bottom of the next tray above.

The stationary heating and cooling station 80 consists of a rectangular structure 90 with an open bottom and a front accessible through a vertically hinged door 92. The structure 90 and the door 92 are formed of a material having good thermal insulation properties and the volume within the station 80 is refrigerated by suitable electrical refrigerating mechanism 94.

The spacing between the side walls and the height of the structure is such that the entire cart 82 may be contained within the volume of the unit 80. The interior of the unit 80 is formed with a plurality of horizontally aligned vertically spaced, two-part shelves 96. Each shelf section 96 includes a stationary top half 98 and a vertically movable lower section 100. Sections 98 are fixed relative to the structure 90 and sections 100 are movable between an open position wherein their upper surfaces abut the lower surface of the associated fixed shelf section 98 and a closed position wherein they are separated from the fixed shelf section.

The cart 82 is moved into the heating and cooling unit 80 while the shelves are in their open position. The trays 30 interleave between the shelf sections 96 with the bottoms of the trays in close proximity to the top surfaces of the stationary shelf sections 98. The movable shelf sections are then actuated downwardly so that their lower surfaces are closely spaced or in direct abutment with the top surfaces of the covers 50. In this position three induction heating coils built into the stationary shelf section are disposed directly below the three hot food sections of the tray and three induction heating coils built into each movable shelf section 100 are in close proximity to the metallic elements 52 forming part of the food container covers.

Figure 8:
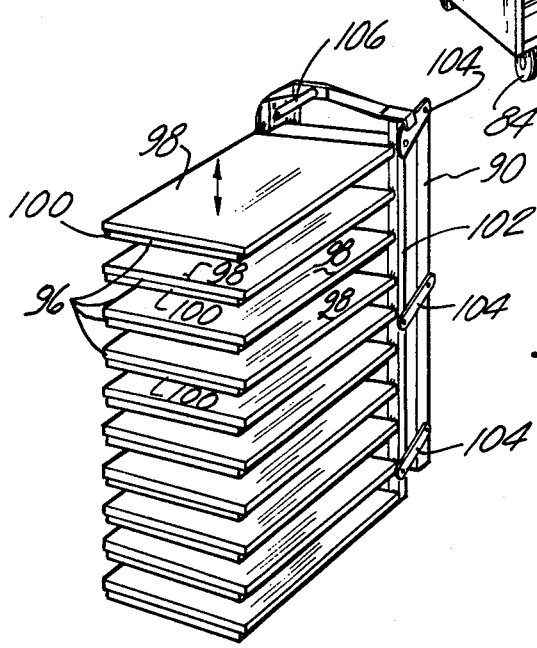
FIG. 8 is a perspective view of the induction heating shelf mechanism of the device of FIG. 7.

FIG. 8 illustrates the shelves 96 and their associated support mechanism as they appear removed from the structure 90 of the heating and cooling unit. The movable shelf sections 100 are fixed to vertical rods 102 that connect to a pivotable link member 104 at their top ends. The link members may be actuated by a push rod 106 that extends the length of the housing 90 along its interior top side and is biased forwardly and pushed rearwardly when the door 92 is closed. In its forward position the links 104 pivot in a counterclockwise direction as viewed in FIG. 8, lifting the rods 102 and bringing the movable shelf sections 100 into their open position. When the door 92 is closed, pushing the rod 106 rearwardly, the links 104 pivot in a clockwise direction, lowering the rods 102 and moving the shelf sections 100 into their closed position.

The stationary unit 80 has its induction heating coils connected by suitable switching means to a source of high frequency alternating current. Switching means (not shown) may provide for individual control of particular elements to adjust the timing of application of heat to containers supported with respect to these coils. The control means might also include appropriate proportional controls, such as a solid state chopper, which effectively regulates the magnitude of the current passing through any induction heating coil.

A mobile unit 120 for supporting and transporting a plurality of food containers formed in accordance with the present invention, and preferably arranged on trays, is illustrated in FIG. 10. This unit may alternatively include a mobile power supply for both the induction heating coils and refrigeration apparatus or may be adapted to connect to stationary power supplies to provide energy for these functions. When the mobile unit does not contain its own power supply for the refrigeration apparatus, the mobile unit may include ice or dry ice compartments to maintain the refrigeration level while disconnected from the power supply.

The cart 120 is movable on wheels 122 and contains a pair of rows of spaced shelf assemblies 124 of the type illustrated in FIG. 8. The unit contains racks on which trays may be inserted so that they are interleaved between a pair of shelves. The mobile unit 120 may be moved into position with respect to a stationary refrigeration apparatus 126 which couples with the mobile unit to refrigerate the volume within the unit.

The electrical power for the unit may be derived from storage batteries supported on the unit or from the electrical power mains when a stationary supply is used. Any conventional high frequency generator may be used to provide the alternating electric current for the induction heating coils. Employing .010 inch aluminum a frequency range of 10,000 to 80 Hz is acceptable.

FIG. 11 illustrates a novel form of alternating current generator for producing current for an induction heating coil, schematically illustrated at 130. The coil is shunted by a capacitor 132 and the pair are disposed in the collector circuit of an NPN transistor 134 which has its emitter grounded. A small tickler coil 136 is physically associated along with the induction heating coil 130 so that its permeability varies along with that of the induction heating coil when a food container formed in accordance with the present invention is placed in their proximity.

The tickler coil is connected in the base circuit of the transistor 134 along with a pair of resistors 138 and 140 which form a voltage divider and a pair of capacitors 142 and 144 which, along with a diode 146, allow for a bias voltage build up after starting. The circuit is completed by a resistor 148 connected to form a feedback path between the tickler coil and the transistor base.

The oscillator thus starts as a Class A-B circuit and builds up to Class C operation. The oscillator frequency is a function of the load so that the tank circuit consisting of the induction heating coil 130 and capacitor 132 is always tuned to the resonant frequency of the circuit.

The embodiments of the invention in which an exclusive property or privilege is claimed are defined as follows:

1. Apparatus for inductively heating a plurality of food portions to different temperatures comprising: a carrier having a plurality of food container receiving sections; a heating compartment with a planar surface adapted to be supported in alignment with the carrier and having a plurality of induction heating coils supported so as to be positioned in alignment with at least some of the plurality of food container receiving sections formed on the carrier; means for passing alternating electric currents through said induction heating coils; a plurality of food containers, each enclosing a food portion, the containers having surface configurations adapting them to be supported in the food container receiving sections of the carrier, each food container including an electrically conductive section whereby electric currents will be induced in the conducting sections to heat the food portions and means varying the heating response of at least some of said containers from one another to said alternating electric currents passed through said induction heating coils, whereby the amount of heat passed into a food portion within a particular food container when disposed on the carrier and in the compartment will vary between at least some of the containers.

2. The apparatus of claim 1 wherein at least certain of the food containers are formed of electrically non-conductive material with bottom and top sections separable relative to one another, each section including an electrically conductive member so positioned that the members are electrically insulated from one another when the sections are joined together to form a closed container for food; and the heating compartment includes a pair of spaced walls adapted to receive the carrier between them, each including induction heating coils adapted to induce heat in the conductive members of the container bottoms or tops.

3. The apparatus of claim 1 wherein said means varying the heating response of at least some of said containers from one another consists of at least certain of the containers having configurations which differ from one another by their metallic sheets having differing resistances.

4. The apparatus of claim 1 wherein said means varying the heating response of at least some of said containers from one another consists of at least certain of the containers having configurations which differ from one another in the spacing of their metallic sheets from their surfaces adapted to be supported relative to said planar surface.

5. The apparatus of claim 1 wherein said induction heating coils and said food receiving sections of the carrier are so positioned that the carrier may be positioned on said planar surface in either a first disposition wherein the coils and food receiving sections are aligned and heating currents are induced in the conductive sections of the containers by the coils or a second disposition wherein the coils and food receiving sections are nonaligned and no substantial heating currents are induced in the conductive sections.

* * * * *